United States Patent
Chen et al.

(10) Patent No.: US 10,937,858 B2
(45) Date of Patent: Mar. 2, 2021

(54) METHOD FOR MANUFACTURING SEMICONDUCTOR AND STRUCTURE THEREOF

(71) Applicant: TAIWAN SEMICONDUCTOR MANUFACTURING COMPANY LTD., Hsinchu (TW)

(72) Inventors: Yang-Che Chen, Hsin-Chu (TW); Chen-Hua Lin, Yunlin County (TW); Huang-Wen Tseng, Hsinchu County (TW); Victor Chiang Liang, Hsinchu (TW); Chwen-Ming Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/852,749

(22) Filed: Apr. 20, 2020

(65) Prior Publication Data

US 2020/0251552 A1 Aug. 6, 2020

Related U.S. Application Data

(63) Continuation of application No. 16/251,723, filed on Jan. 18, 2019, now Pat. No. 10,629,673.

(60) Provisional application No. 62/737,000, filed on Sep. 26, 2018.

(51) Int. Cl.
   *H01L 49/02* (2006.01)
   *H01L 27/06* (2006.01)

(52) U.S. Cl.
   CPC .......... *H01L 28/60* (2013.01); *H01L 27/0629* (2013.01)

(58) Field of Classification Search
   CPC . H01L 28/60; H01L 27/0629; H01L 23/5223; H01L 22/34
   See application file for complete search history.

(56) References Cited

U.S. PATENT DOCUMENTS

2012/0261832 A1* 10/2012 Takano ............. H01L 23/49827
                                                            257/774

\* cited by examiner

*Primary Examiner* — Kyoung Lee
(74) *Attorney, Agent, or Firm* — WPAT, P.C., Intellectual Property Attorneys; Anthony King

(57) ABSTRACT

A method of manufacturing a semiconductor structure is provided. The method includes: providing a substrate including an electrical component; forming a capacitor structure in the substrate, proximal to a heterogeneous interface of the substrate, and physically and electrically isolated from the electrical component; forming a conductive terminal over and electrically connected with the capacitor structure; and contacting the conductive terminal with a probe to measure an electrical parameter of the capacitor structure, wherein the electrical parameter corresponds to a humidity permeability at the heterogeneous interface. A semiconductor structure thereof is also provided.

20 Claims, 14 Drawing Sheets

SB10

METHOD FOR MANUFACTURING SEMICONDUCTOR AND STRUCTURE THEREOF

PRIORITY CLAIM AND CROSS-REFERENCE

This application claims the benefit of prior-filed provisional application No. 62/737,000, filed on Sep. 26, 2018, entitled "A DETECTION METHOD OF A SEMICONDUCTOR STRUCTURE, A SEMICONDUCTOR DEVICE AND A METHOD FOR MANUFACTURING THE SAME", and non-provisional application Ser. No. 16/251,723 filed on Jan. 18, 2019, entitled "METHOD FOR MANUFACTURING SEMICONDUCTOR AND STRUCTURE THEREOF," the disclosure of which is hereby incorporated by reference in its entirety.

BACKGROUND

The semiconductor integrated circuit (IC) industry has experienced rapid growth. Technological advances in design and IC materials have created successive IC generations each with circuits smaller and more complex than those of the previous generation. A complex and reduced-sized IC structure is prone to defects or physical damage, where such defects or damage can result in malfunction or change in electrical properties of electrical components in the IC structure. Efforts to obtain a high yield rate represent an ongoing focus of manufacturers that requires continuous monitoring and identification of production problems that adversely impact yield.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
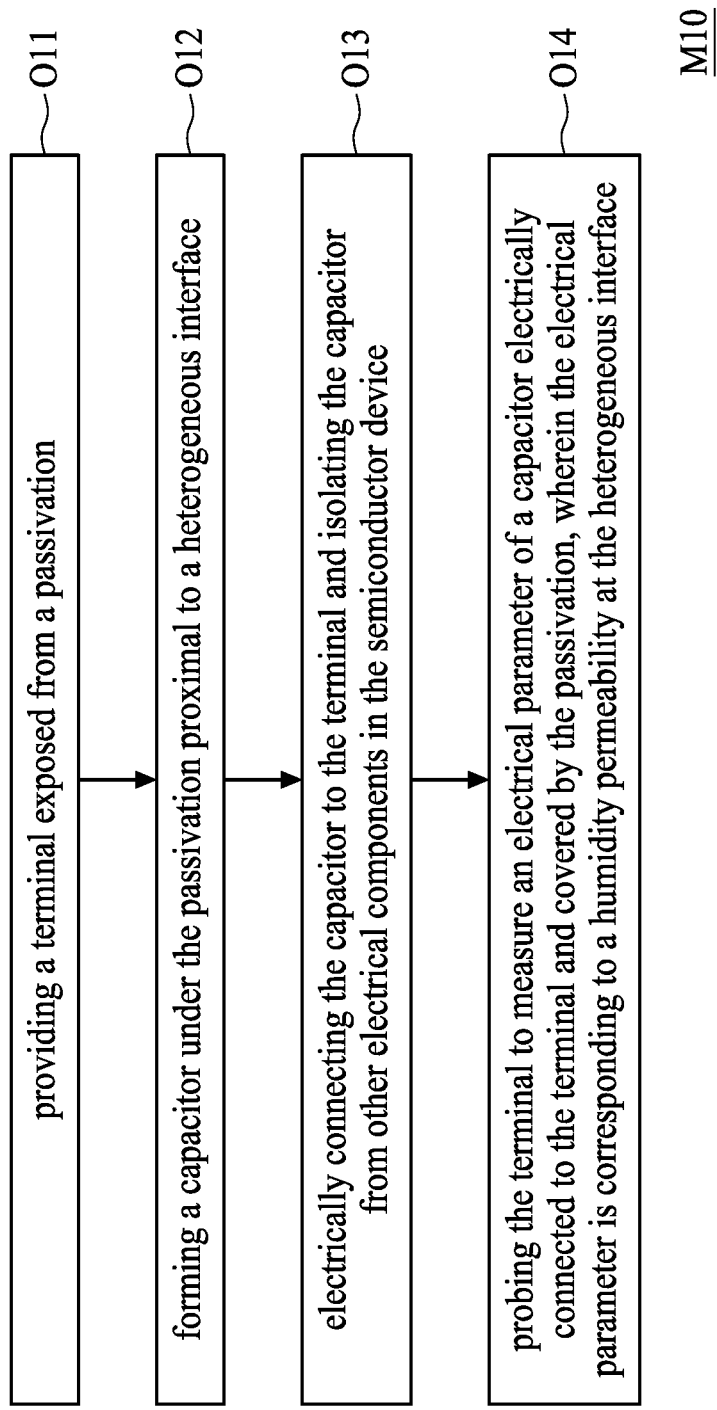
FIG. 1 is a flowchart in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±50, less than or equal to ±40, less than or equal to ±3°, less than or equal to ±2°, less than or equal to ±10, less than or equal to ±0.5°, less than or equal to ±0.10, or less than or equal to ±0.05°. For example, "substantially" perpendicular can refer to a range of angular variation relative to 90° that is less than or equal to ±10°, such as less than or equal to ±5°, less than or equal to ±40, less than or equal to ±3°, less than or equal to ±2°, less than or equal to ±1°, less than or equal to ±0.5°, less than or equal to ±0.1°, or less than or equal to ±0.050.

In accordance with some embodiments of the present disclosure, a method M10 for manufacturing a semiconductor device is provided as shown in FIG. 1. The method includes: (O11) providing a terminal exposed from a passivation; (O12) forming a capacitor under the passivation proximal to a heterogeneous interface; (O13) electrically connecting the capacitor to the terminal and isolating the capacitor from other electrical components in the semiconductor device; and (O14) probing the terminal to measure an electrical parameter of a capacitor electrically connected to the terminal and covered by the passivation, wherein the electrical parameter corresponds to a humidity permeability at the heterogeneous interface. It should be noted that the sequence of operations (O11) to (O14) as shown in FIG. 1 illustrates merely a spirit of the present disclosure but is not intended to limit a manufacturing sequence of the operations (O11) to (O14).

To further illustrate concepts of the present disclosure, FIGS. 2 to 14 are provided for purposes of ease of understanding but are not intended to limit the present disclosure. In accordance with some embodiments of the present disclosure, a semiconductor structure SB10 includes a substrate 10, a capacitor structure 11, a conductive terminal 12 and a passivation 13. In accordance with the operations (O11) and (O12) of the method M10 and some embodiments of the present disclosure, the substrate 10 is received. The substrate 10 includes a dielectric layer 101, and a capacitor structure 11 is formed and embedded in the dielectric layer 101 of the substrate 10. In some embodiments, the dielectric layer 101 includes low-k dielectric materials (i.e. materials having a dielectric constant k smaller than 3.9). In some embodiments, the semiconductor structure 10 does not includes high-k dielectric materials (i.e. materials having a dielectric constant k smaller than 3.9).

Figure 2:
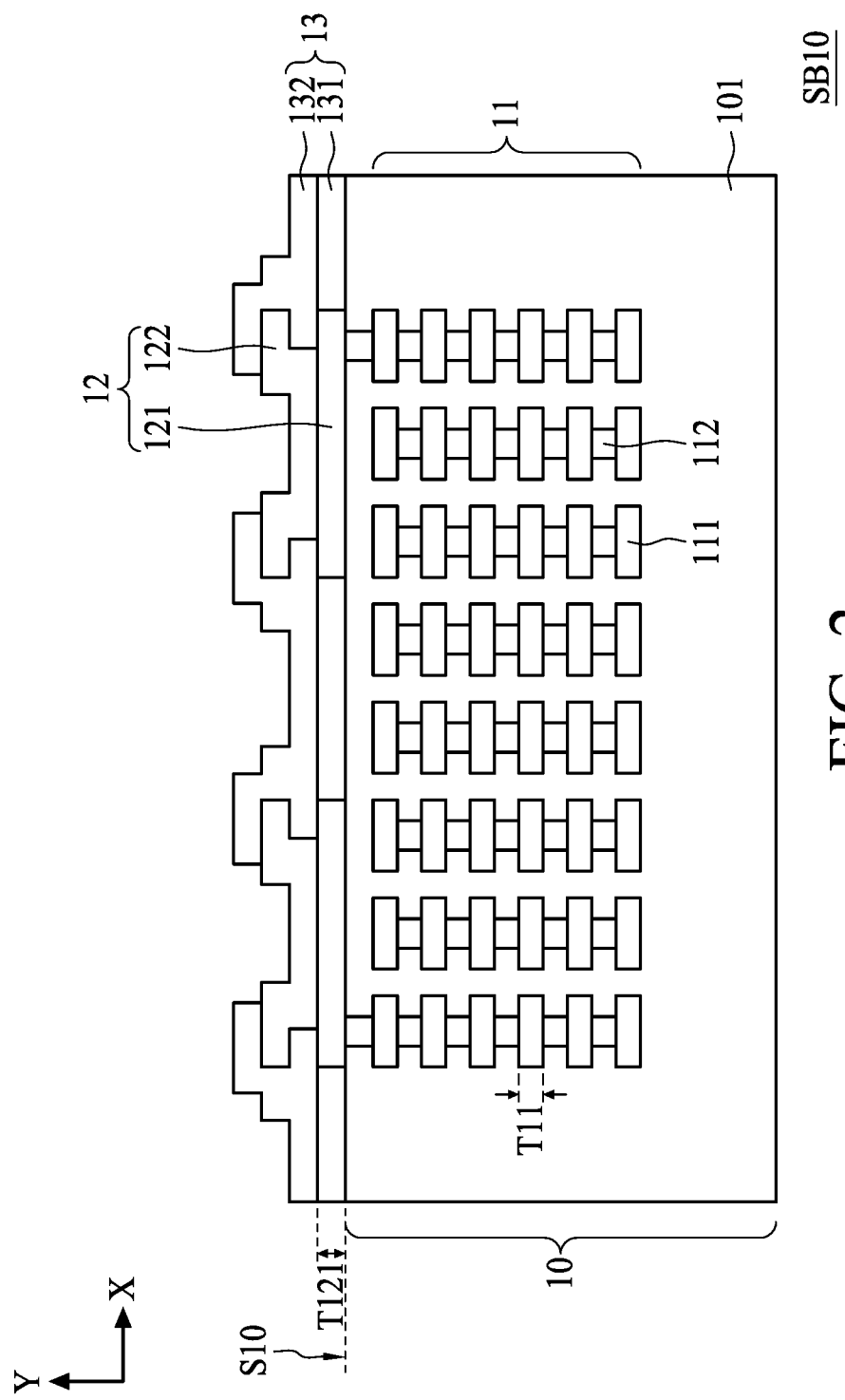
FIG. 2 is a cross-sectional view of a semiconductor structure in one of numerous operations in accordance with some embodiments of the present disclosure.
Figure 3:
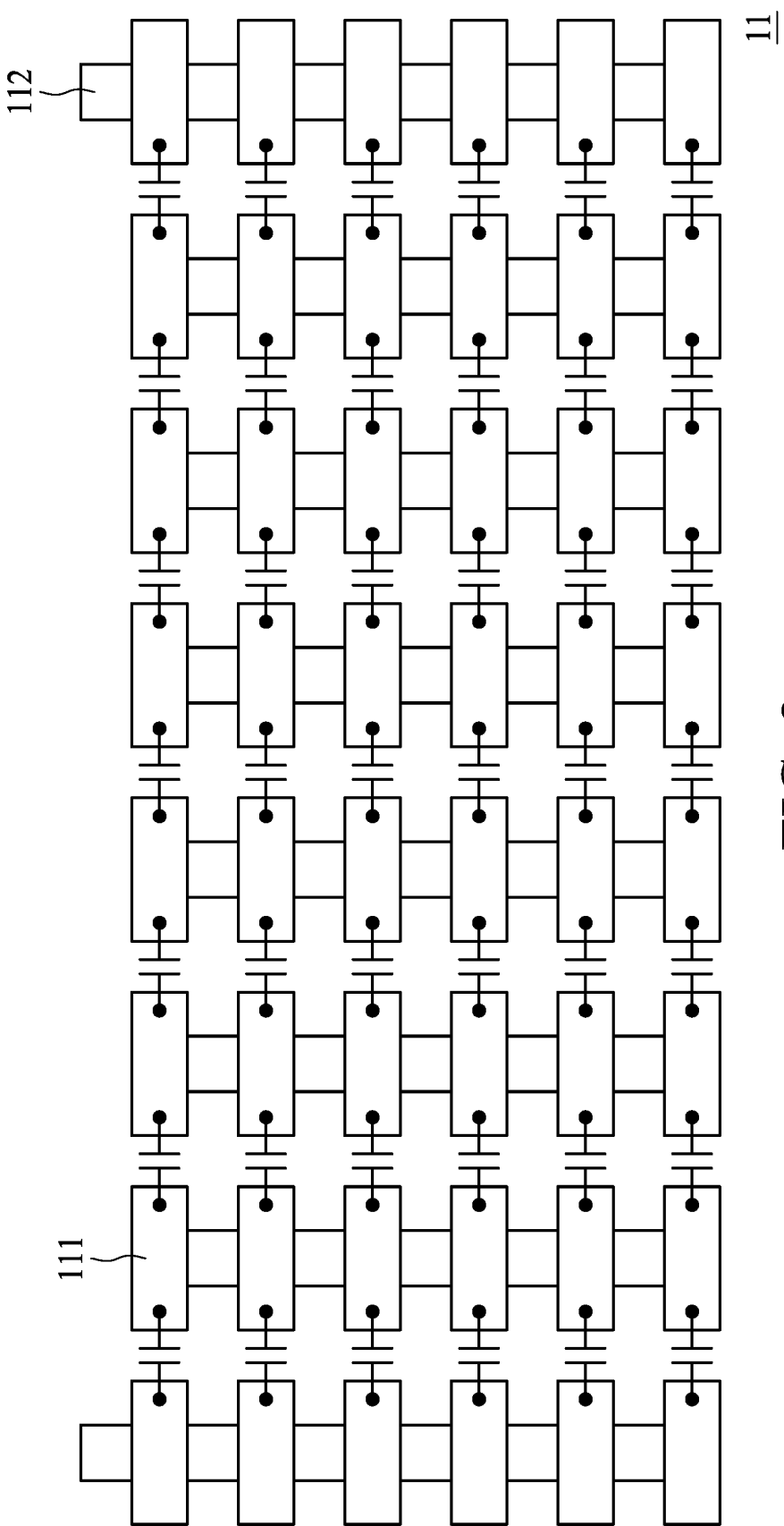
FIG. 3 is a diagram showing multiple capacitors of a capacitor structure in electrical symbols from a cross-sectional view of a semiconductor structure in accordance with some embodiments of the present disclosure.

In some embodiments of the present disclosure, the capacitor structure 11 is a single capacitor (not shown in the figures). In some embodiments of the present disclosure, the capacitor structure 11 includes a plurality of capacitors, as shown in FIG. 2. In some embodiments of the present disclosure, the one or more capacitors of the capacitor structure 11 are floating capacitors. In some embodiments of the present disclosure, the plurality of capacitors of the capacitor structure 11 forms a string of capacitors connected in parallel along an extending direction (e.g., an X direction in the embodiments) of the substrate 10 as shown in FIG. 2. FIG. 3 is a diagram showing electrical symbols for every capacitor of the capacitor structure 11 for easier understanding and to illustrate arrangement of the capacitors in the substrate 10.

Figure 6:
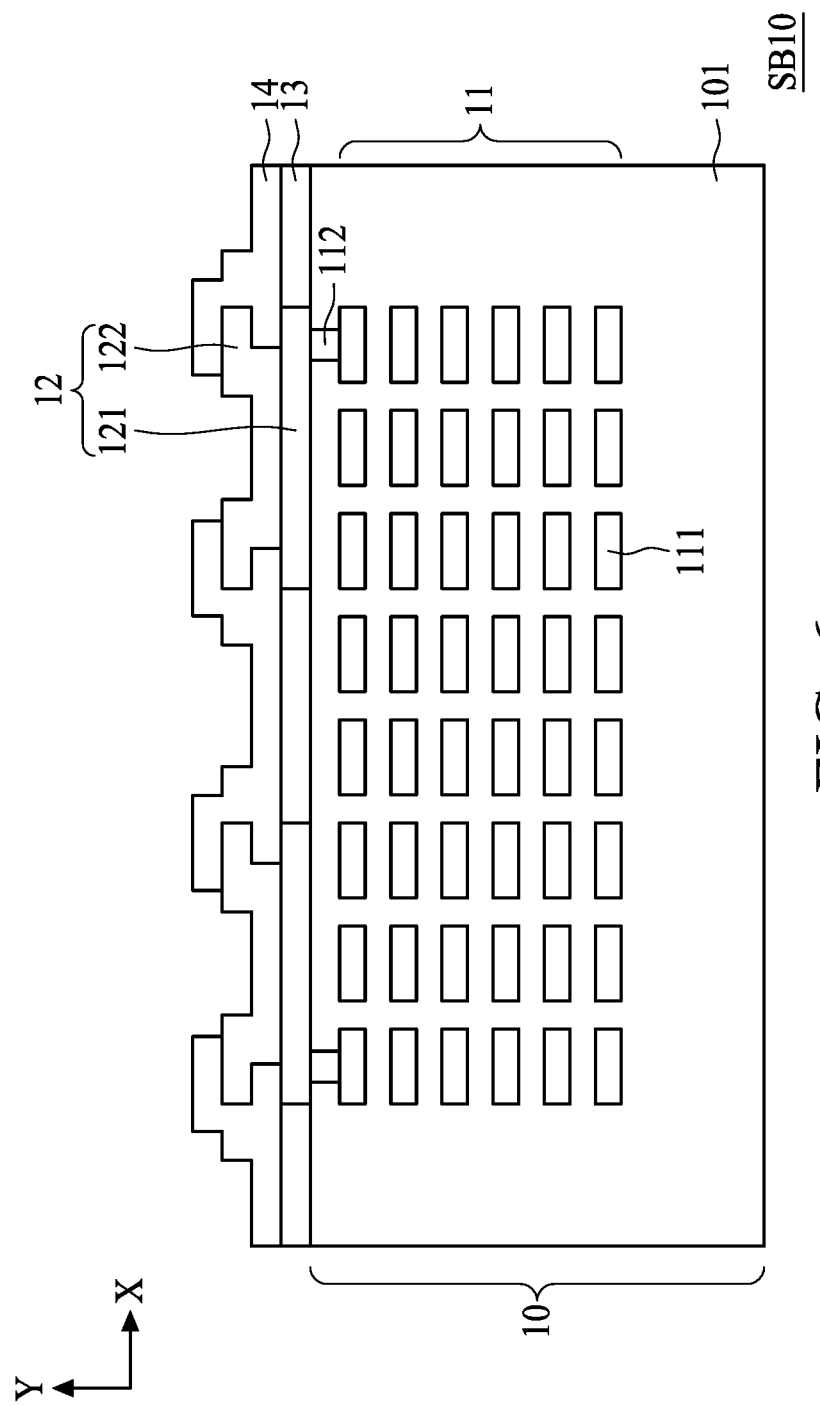
FIG. 6 is a cross-sectional view of a semiconductor structure in one of numerous operations in accordance with some embodiments of the present disclosure.
Figure 7:
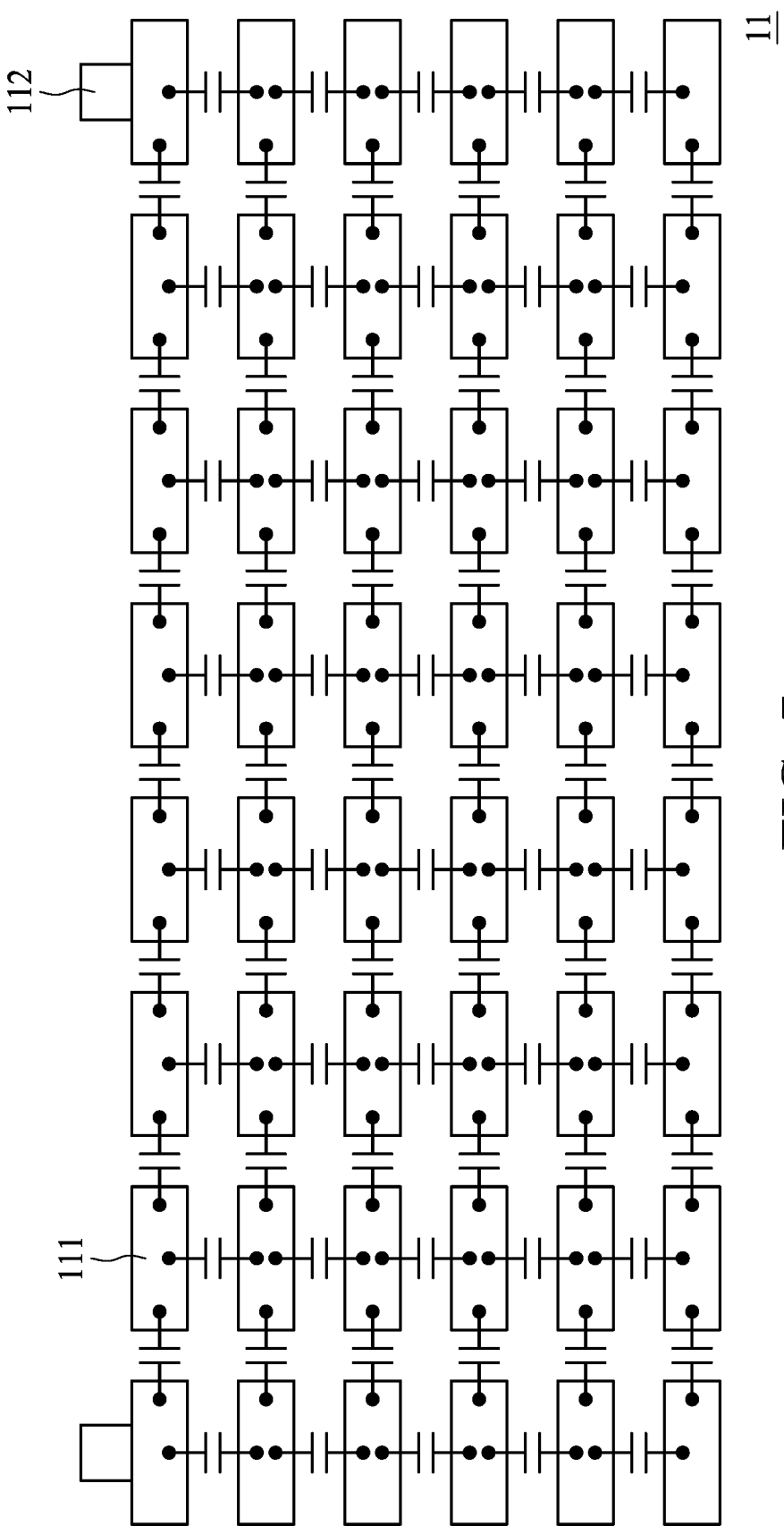
FIG. 7 is a diagram showing multiple capacitors of a capacitor structure in electrical symbols from a cross-sectional view of a semiconductor structure in accordance with some embodiments of the present disclosure.

In some embodiments of the present disclosure, the plurality of capacitors of the capacitor structure 11 forms an array of capacitors connected in parallel along the extending direction of the substrate 10 and connected in series along a direction (e.g., a Y direction in the embodiments) perpendicular to the extending direction of the substrate 10. Referring to FIG. 6, in accordance with other embodiments of the present disclosure, the capacitors of the capacitor structure 11 are connected in two directions to form an array (or a wall) of the capacitor structure 11. FIG. 7 is a diagram showing electrical symbols for every capacitor of the capacitor structure 11 to illustrate arrangement of the capacitors in the substrate 10. In some embodiments of the present disclosure, the plurality of capacitors of the capacitor structure 11 forms a string of capacitors connected vertically in series (not shown in the figures). All capacitors of the capacitor structure 11 are electrically connected, although the connections may not be illustrated in FIGS. 2 to 3 and FIGS. 6 to 7. For ease of understanding and illustration, in the following description, the embodiments having the capacitor structure 11 as shown in FIGS. 2 and 3 are used. However, such description is not intended to limit the present disclosure to specific embodiments.

Figure 8:
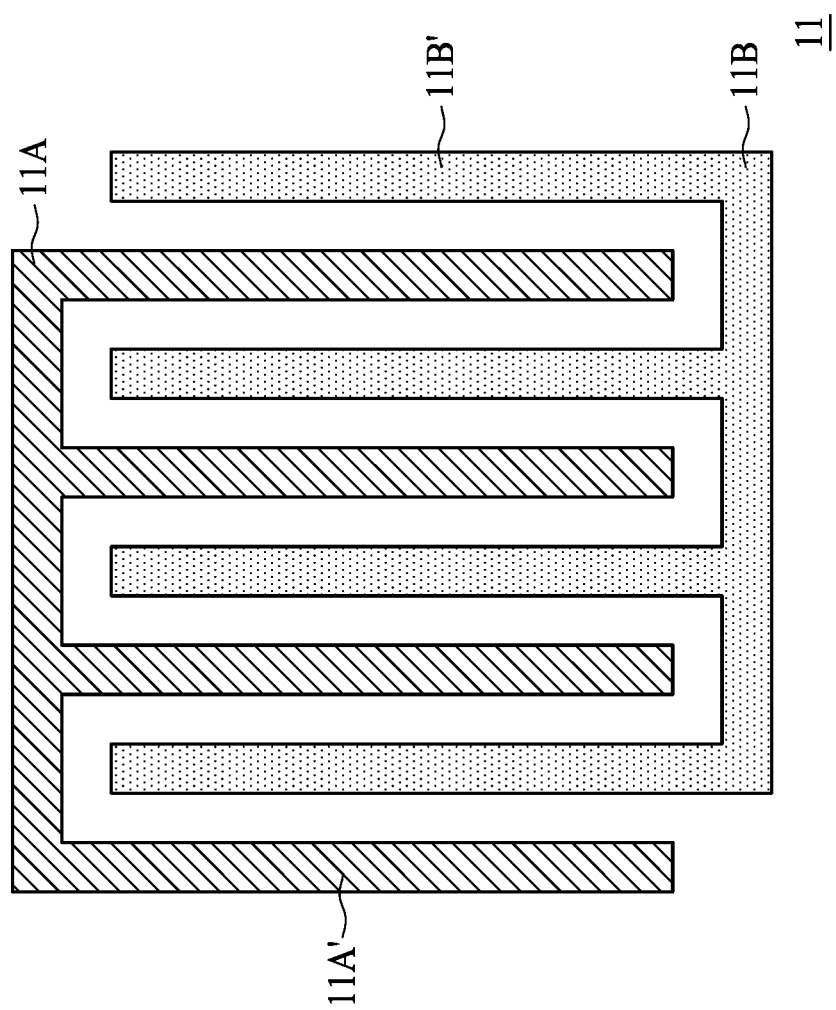
FIGS. 8 and 9 are top views of a capacitor structure in accordance with different embodiments of the present disclosure.
Figure 9:
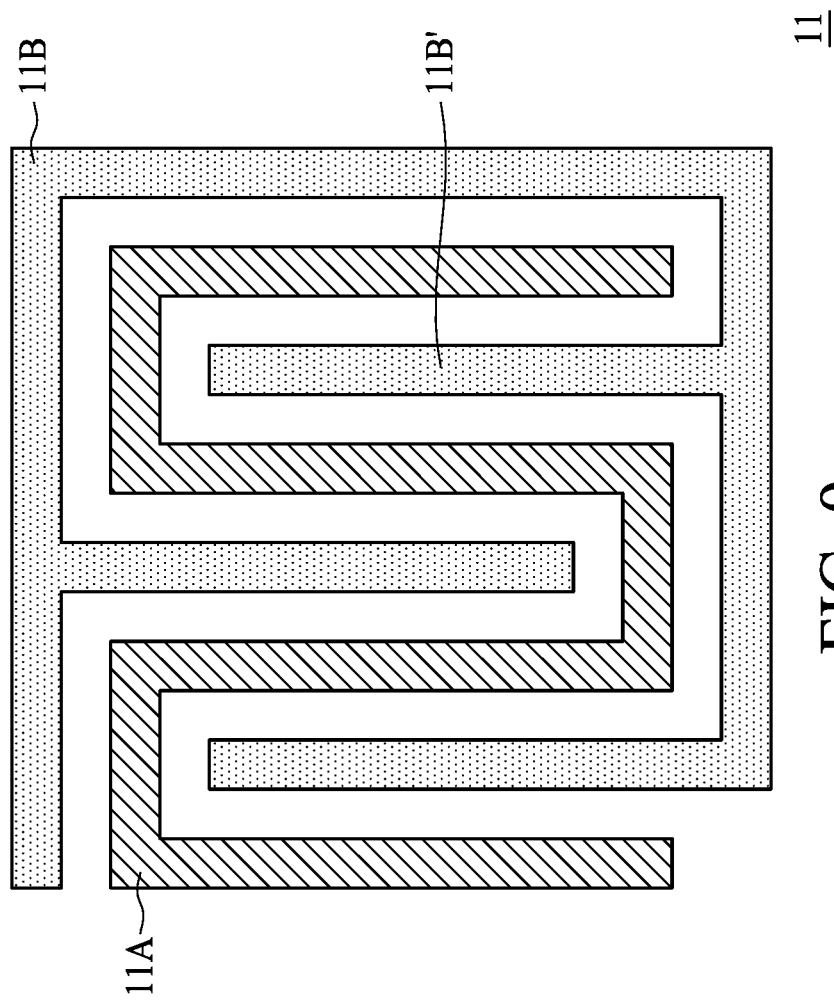

A pattern of the capacitor structure 11 as seen from a top view can be different in accordance with different applications. In accordance with some embodiments of the present disclosure, electrodes 11A and 11B of the capacitor structure 11 are arranged as shown in FIG. 8. The electrodes 11A and 11B can have multiple derived portions 11A' and 11B' respectively. The derived portions 11A' and the derived portions 11B' are alternately arranged as seen from the top view to increase a capacitance of the capacitor structure 11. In some other embodiments of the present disclosure as shown in FIG. 9, the electrode 11A is formed in a meandering pattern. The electrode 11B includes multiple derived portions 11B'. The derived portions 11B' of the electrode 11B and the electrode 11A are alternately arranged. However, the present disclosure is not limited thereto.

Referring back to FIG. 2, in accordance with some embodiments of the present disclosure, a conductive terminal 12 is formed over the substrate 10 and over the capacitor structure 11. In accordance with the operation (O13) of the method M10 and some embodiments of the present disclosure, the conductive terminal 12 electrically connects with the capacitor structure 11, wherein the capacitor structure 11 is isolated from other electrical components (not shown in the figures) in the semiconductor structure SB10. In some embodiments of the present disclosure, the capacitor structure 11 is physically and electrically isolated from other electrical components in the semiconductor structure SB10. It should be noted that for ease of illustration, semiconductor structures SB10, SB20 and SB21 as shown in the figures represent merely a portion of the semiconductor structures SB10, SB20 and SB21.

In some embodiments of the present disclosure, the conductive terminal 12 includes a metal layer 121 and a conductive pad 122. The metal layer 121 is at a top surface S10 of the substrate 10, and the conductive pad 122 is formed on the metal layer 121 and over the top surface S10 of the substrate 10. The conductive pad 122 electrically connects with the metal layer 121. In some embodiments of the present disclosure, the conductive pad 122 is electrically connected with the metal layer 121 by physical contact. In some embodiments of the present disclosure, a plurality of conductive terminals 12 are formed to electrically connect to different electrodes (e.g., the electrode 11A and the electrode 11B) of the capacitor structure 11 respectively, as shown in FIG. 2.

A passivation 13 is formed at the top surface S10 of the substrate 10 covering a portion of the conductive terminal 12. A heterogeneous interface is formed, and the capacitor structure 11 is under the passivation layer and proximal to the heterogeneous interface. At least a portion of the conductive terminal 12 is exposed from the passivation 13. The heterogeneous interface can be any interface between different materials having different coefficients of thermal extension. For instance, the interface between the conductive terminal 12 and the passivation 13 as shown in FIG. 2 is a heterogeneous interface.

In some embodiments of the present disclosure, the passivation 13 is a multi-layer structure. Referring to FIG. 2, in the embodiments, the passivation 13 includes a passivation layer 131 and a passivation layer 132. The passivation layer 131 is formed on the top surface S10 of the substrate 10 and adjacent to the metal layer 121 of the conductive terminal 12. A heterogeneous interface proximal to the capacitor structure 11 is formed between the metal layer 121 and the passivation layer 131. In some embodiments, a top surface of the passivation layer 131 is coplanar with a top surface of the metal layer 121. The passivation layer 132 is formed conformally over the passivation layer 131 and the conductive pad 122. A portion of the conductive pad 122 of the conductive terminal 12 is exposed from the passivation layer 132 of the passivation 13. The conductive terminal 12 provides an electrical connection between an external ambiance and the capacitor structure 11.

In some embodiments, the conductive terminal 12 includes Aluminum (Al), Chromium (Cr), Gold (Au), Molybdenum (Mo), Platinum (Pt), Tantalum (Ta), Titanium (Ti), Silver (Ag), Copper (Cu), Tungsten (W) and/or an alloy thereof. In some embodiments, the metal layer 121 includes cupper, and the conductive pad 122 includes aluminum. Materials of the metal layer 121 and the conductive pad 122 can be the same or different, it is not limited herein. In some embodiments, the passivation 13 includes nitride, oxide, oxynitride, silicon oxide, silicon nitride, silicon oxynitride, other suitable materials or combination thereof. In some embodiments, materials of the passivation layer 131 and the passivation layer 132.

Figure 4:
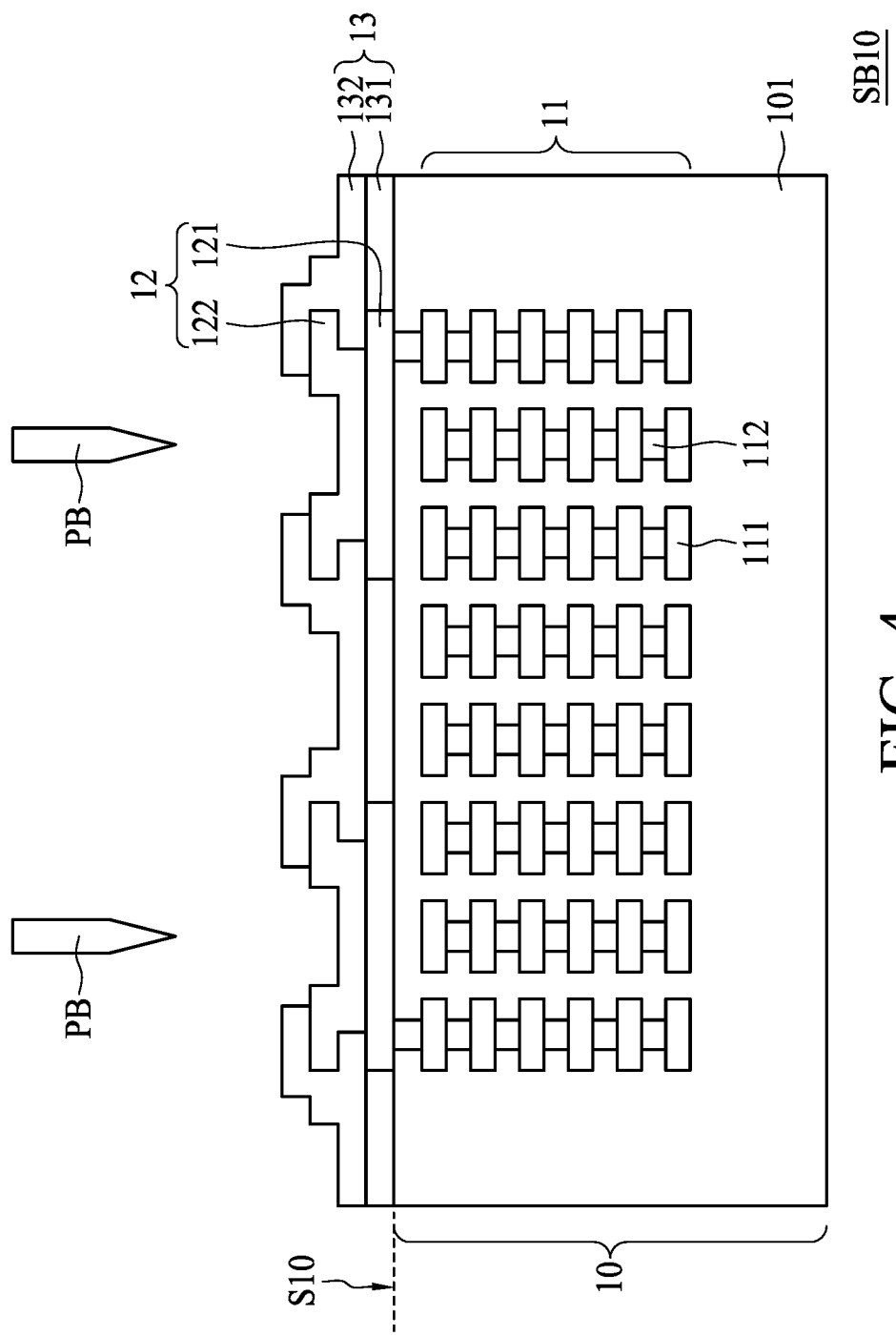
FIGS. 4 and 5 are cross-sectional views of a semiconductor structure in one of numerous operations respectively in accordance with some embodiments of the present disclosure.

Referring to FIG. 4, in accordance with the operation (O14) of the method M10 and some embodiments of the present disclosure, the conductive terminal 12 is contacted with a probe PB to measure an electrical parameter of the capacitor structure 11. The electrical parameter corresponds to a humidity permeability near (or at) the heterogeneous interface. In some embodiments of the present disclosure, the electrical parameter is a leakage current of the capacitor structure 11 between the electrodes 11A and 11B. In some embodiments of the present disclosure, the electrical parameter is a resonant frequency of the capacitor structure 11. In some embodiments of the present disclosure, the operation (O14) is performed multiple times to acquire different electrical parameters of the capacitor structure 11. In some embodiments of the present disclosure, the conductive terminal 12 is probed multiple times to measure the leakage current and the resonant frequency of the capacitor structure 11. In some embodiments of the present disclosure, the method M10 further includes determining whether the electrical parameter is within a predetermined range.

Different materials may have different coefficients of thermal expansion. As a result, a heterogeneous interface is required to sustain different tensile stresses and compression pressures from different adjacent materials, or cracks can easily occur near or at the heterogeneous interface. If a crack occurs, a humidity permeability to the inside of the substrate 10 or the semiconductor structure SB10 is increased. As a result, electrical characteristics of the electrical components around the crack adjacent thereto may be affected. Therefore, in order to detect and analyze a defect and thus to improve product yield, the conductive terminal 12 is probed to measure the electrical parameter of the capacitor structure 11 proximal the heterogeneous interface, to determine whether any cracks have occurred.

In some embodiments of the present disclosure, to determine a leakage current between the electrodes of the capacitor structure 11 being measured, different electric potentials are provided to the electrodes 11A and 11B in order to generate a voltage between the electrodes 11A and 11B of the capacitor structure 11. If a leakage current is greater than a default value by a predetermined range (e.g., 10% of the default value), a crack is determined to exist. In some embodiments of the present disclosure, a resonant frequency of the capacitor structure 11 is measured, wherein a shift of the resonant frequency of the capacitor structure 11 is detected if a crack exists due to a change in a level of the humidity permeability. If the resonant frequency of the capacitor structure 11 shifts from a default value by an amount greater than a predetermined range (e.g., 10% of the default value, or another suitable percentage or value), a crack is determined to exist due to a high humidity permeability.

In some embodiments of the present disclosure, the operation of measuring the electrical parameters of the capacitor structure 11 is performed in a non-destructive manner, i.e., without damaging the passivation 13. In some embodiments of the present disclosure, the operation of probing the conductive terminal 12 is performed as an in-line examination, and a defect can be detected before the semiconductor structure SB10 is packaged. In some embodiments of the present disclosure, a surface analysis is performed on the heterogeneous interface to examine a condition and status of the defect, if the electrical parameter is not within the predetermined range. In some embodiments of the present disclosure, a cross-section check or a destructive examination is performed to examine a condition and details of the defect, if the electrical parameter is not within the predetermined range.

Figure 5:
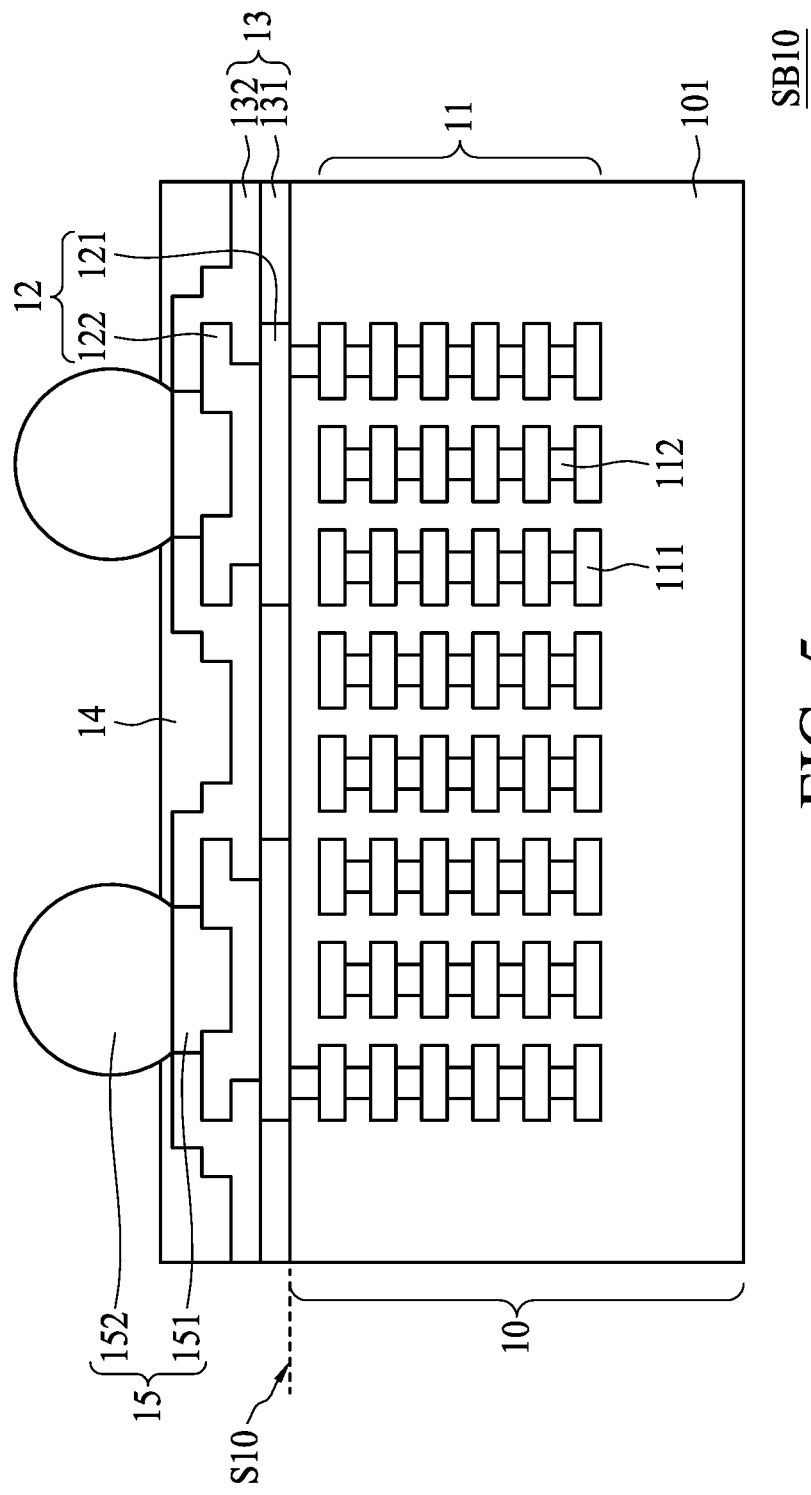

Referring to FIG. 5, in accordance with some embodiments of the present disclosure, the method M10 further includes forming a polymeric layer 14 over the passivation 13. In some embodiments of the present disclosure, the polymeric layer 14 includes polybenzoxazde (PBO). In some embodiments of the present disclosure, the polymeric layer 14 includes another suitable polymer for purposes of humidity resistance and stress resilience. In some embodiments of the present disclosure, the polymeric layer 14 has a substantially flat surface away from the passivation 13, and has a conformal surface having a profile substantially conformal to a profile of the passivation 13. The conformal surface of the polymeric layer 14 is adjacent to the passivation 13.

In accordance with some embodiments of the present disclosure, the method M10 further includes forming a contact 15, wherein the contact 15 is electrically connected with the capacitor structure 11 via the conductive terminal 12, as shown in FIG. 5. The contact 15 is formed over the conductive terminal 12 and adjacent to the passivation 13 and the polymeric layer 14. In some embodiments of the present disclosure, the contact 15 is formed between portions of the passivation 13 and is surrounded by the passivation 13 as seen from a top view. In some embodiments of the present disclosure, the contact 15 is formed between portions of the polymeric layer 14 and is surrounded by the polymeric layer 14 as seen from a top view.

In some embodiments of the present disclosure, the contact 15 includes a contact pad 151, as shown in FIG. 5, formed between portions of the passivation layer 132 and over the conductive pad 122. In some embodiments of the present disclosure, a top surface of the contact pad 151 is substantially coplanar with a top surface of the passivation layer 132. In some embodiments of the present disclosure, the contact 15 further includes a contact ball 152, as shown in FIG. 5, formed over the contact pad 151 and electrically connected with the capacitor structure 11 via the contact pad 151 and the conductive terminal 12. In some embodiments of the present disclosure, the contact ball 152 includes tin or other suitable materials.

In accordance with some embodiments of the present disclosure, the capacitor structure 11 is formed concurrently with an interconnection structure in an active area of the semiconductor structure SB10, and no extra photomask or operations are required. In some embodiments of the present disclosure, the capacitor structure 11 includes a plurality of metal layers 111 and a plurality of via layers 112 as shown in FIGS. 2 and 4 to 6. In some embodiments of the present disclosure, the via layers 112 and the metal layers 111 are stacked alternately in order to electrically connect different metal layers 111 to each other. In some embodiments of the present disclosure, each of the metal layers 111 includes a metal pattern to form a string of capacitors in parallel as shown in FIGS. 2 and 3. In some embodiments of the present disclosure, each of the metal layers 111 includes a metal pattern, and the metal patterns are stacked in sequence, and adjacent metal layers 111 are vertically and electrically isolated from each other by the dielectric layer 101 from a cross-sectional view.

In some embodiments, portions of the metal patterns of the metal layers 111 are aligned vertically, and portions of the metal pattern of one metal layer 111 are aligned horizontally at the same level of elevation from the cross-sectional view. In some embodiments, a via layer 112 includes a plurality of metal vias. In some embodiments, the metal vias of the via layer 112 are aligned in parallel at the same level of elevation from the cross-sectional view. In some embodiments, the metal vias of different via layers 112 are aligned vertically to electrically connect the two adjacent metal layers.

In some embodiments of the present disclosure, the metal layers 111, the via layers 112 and the dielectric layer 101 together form a capacitor array as shown in FIGS. 8 and 9. Each of the metal layers 111 includes a metal pattern. In some embodiments of the present disclosure, portions of different metal patterns and the dielectric layer 101 together form a capacitor. In some embodiments of the present disclosure, different portions of a metal pattern and the dielectric layer 101 together form a capacitor. In some embodiments of the present disclosure, the metal layer 121 has a thickness T121 greater than a thickness T11 of any one of the metal layers 111 of the capacitor structure 11 shown in FIG. 2.

Figure 10:
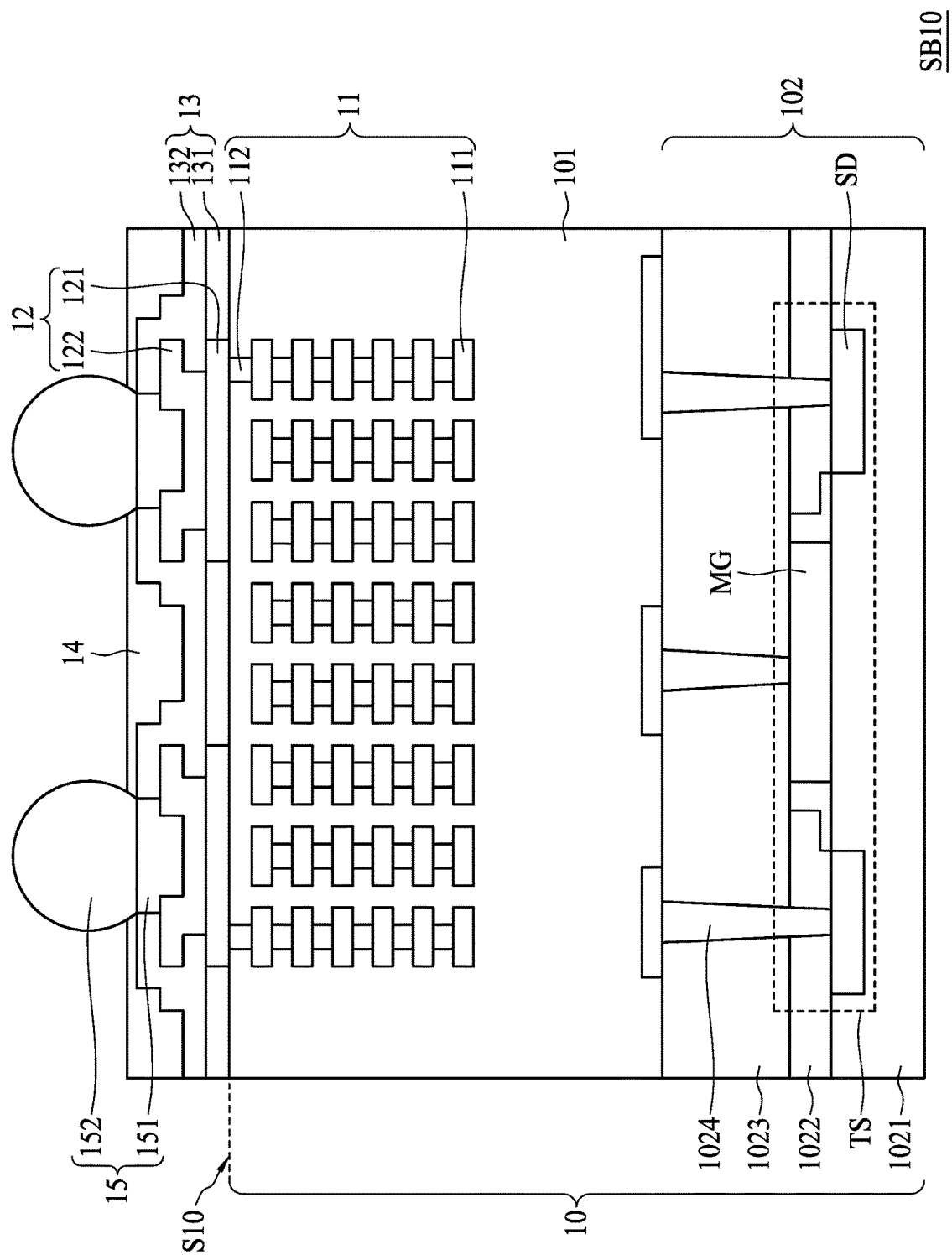
FIG. 10 is a cross-sectional view of a semiconductor structure over a carrier substrate in accordance with some embodiments of the present disclosure.

Referring to FIG. 10, in accordance with some embodiments of the present disclosure, the substrate 10 is a semiconductive substrate or semiconductor wafer. In some embodiments the dielectric layer 101 is an inter-metal dielectric (IMD) layer, and the substrate 10 further includes a transistor structure 102 formed under the dielectric layer 101. The transistor structure 102 includes a plurality of transistors TS formed over a base 1021. In some embodiments, the base is a silicon substrate. For ease of illustration, only one transistor TS is shown in FIG. 10, but it is not intended to limit the present disclosure. The transistor TS includes a source/drain region SD formed in the base 1021 and a gate structure MG (e.g. a metal gate structure) formed over the base 1021 surrounded by a dielectric layer 1022 on the base 1021. In some embodiments, the carrier substrate 20 also includes an inter-layer dielectric layer 1023 and contact via 1024. The inter-layer dielectric layer 1023 is formed over the base 1021 and between the IMD layer and the plurality of transistors in order to electrical isolate the contact via 1024. The contact via 1024 formed in and penetrated through the inter-layer dielectric layer 1023 to electrically connect the transistors and an interconnection structure (or metal wirings) in the IMD layer. The electrical connection between the transistors TS to the external ambiance is not seen in FIG. 10 from the cross-sectional view.

In some embodiments of the present disclosure, the capacitor structure 11 is electrically isolated from other electrical components (e.g. the transistors as illustrated above and in FIG. 10) of the semiconductor structure SB10. In some embodiments of the present disclosure, the capacitor structure 11 is formed in a scribe line, a test key or a test area. The test area is electrically isolated from other electrical components of the semiconductor structure SB10 for a purpose of examination of a mirrored structure formed in the active area.

In accordance with some embodiments of the present disclosure, the method M10 further includes defining an active area and a test area. In some embodiments of the present disclosure, the heterogeneous interface is in the test area, which is electrically isolated from the active area. For instance, the test area can be in the scribe line of the semiconductor structure SB10, and the active area can be a die of the semiconductor structure SB10. In some embodiments of the present disclosure, the method M10 further includes forming a structure in the active area where the structure mirrors the heterogeneous interface. In some embodiments of the present disclosure, the active area also includes a heterogeneous interface. In order to examine a humidity permeability near or at the heterogeneous interface in the active area, the active area includes the structure mirroring the heterogeneous interface in the test area. Thus, a percentage of defects occurring in a certain structure having the same heterogeneous interface can be calculated, and an improvement to the certain structure can be achieved based on the electrical parameters obtained from the operation of taking measurements with a probe.

In some embodiments of the present disclosure, the method M10 further includes using the electrical parameters to adjust a specification of the semiconductor structure SB10. In some embodiments of the present disclosure, the method M10 further includes forming a semiconductor device based on the adjusted specifications of the semiconductor structure. In some embodiments of the present disclosure, in order to increase adhesion between the metal layer 121 and the passivation 13, the metal layer 121 has a tapered configuration from a cross-sectional view (not shown). The metal layer 121 includes a narrow top and a wide bottom.

Figure 11:
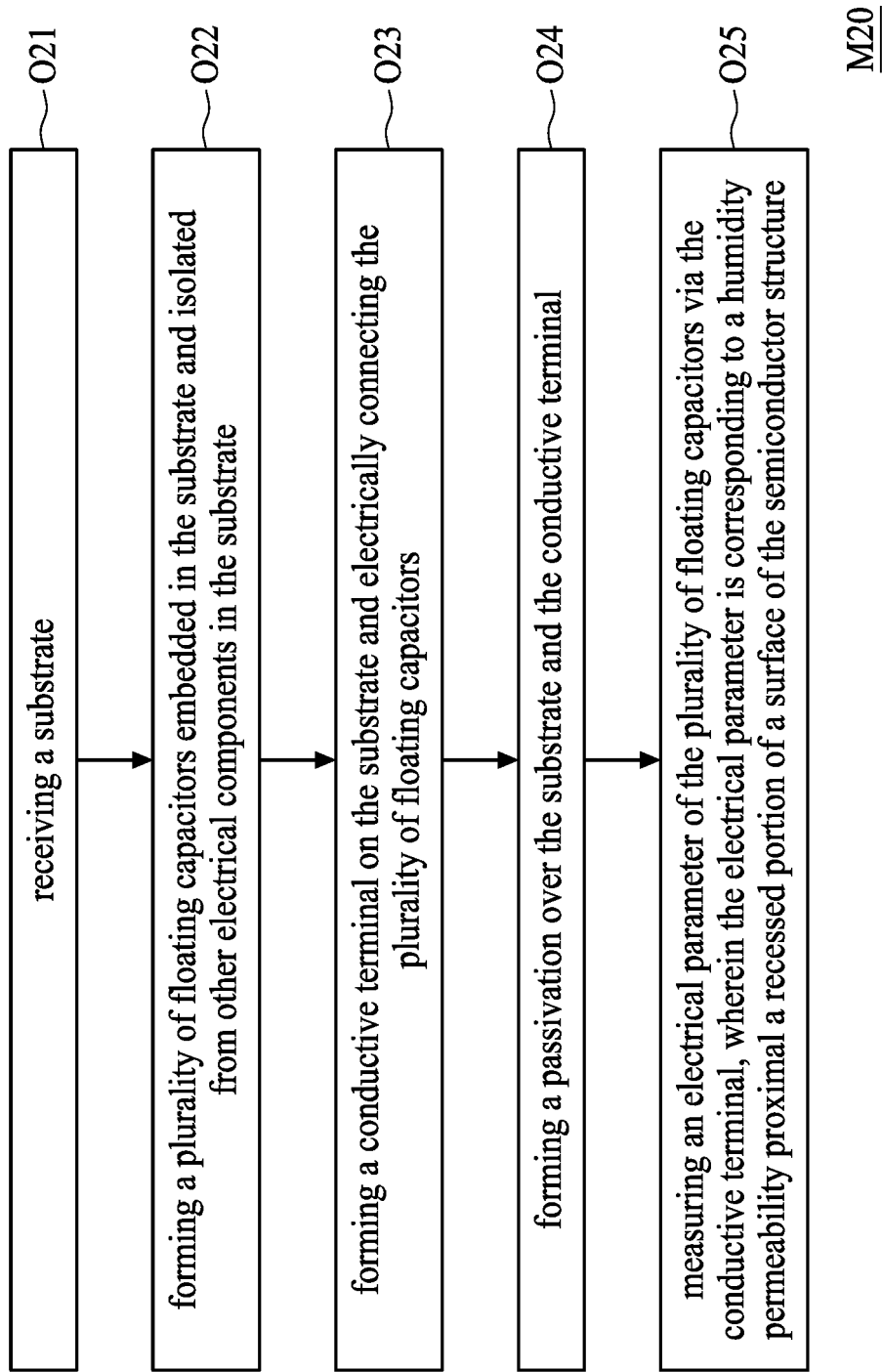
FIG. 11 is a flowchart in accordance with some embodiments of the present disclosure.

Based on the same concept as the method M10 described above, the present disclosure also provides a method M20 as shown in FIG. 11. The method M20 includes: (O21) receiving a substrate; (O22) forming a plurality of floating capacitors embedded in the substrate and isolated from other electrical components in the substrate; (O23) forming a conductive terminal on the substrate and electrically connected with the plurality of floating capacitors; (O24) forming a passivation over the substrate and the conductive terminal, and (O25) measuring an electrical parameter of the plurality of floating capacitors via the conductive terminal, wherein the electrical parameter corresponds to a humidity permeability proximal to a recessed portion of a surface of the semiconductor structure. It should be noted that the sequence of operations (O21) to (O25) as shown in FIG. 11 illustrates merely a spirit of the present disclosure, and is not intended to limit a manufacturing sequence of the operations (O21) to (O25).

For purposes of ease of understanding and illustration, same reference numbers are used to represent elements with same or similar functions as those illustrated in FIGS. 2 to 10. However, such numbering is not intended to limit the present disclosure.

Figure 12:
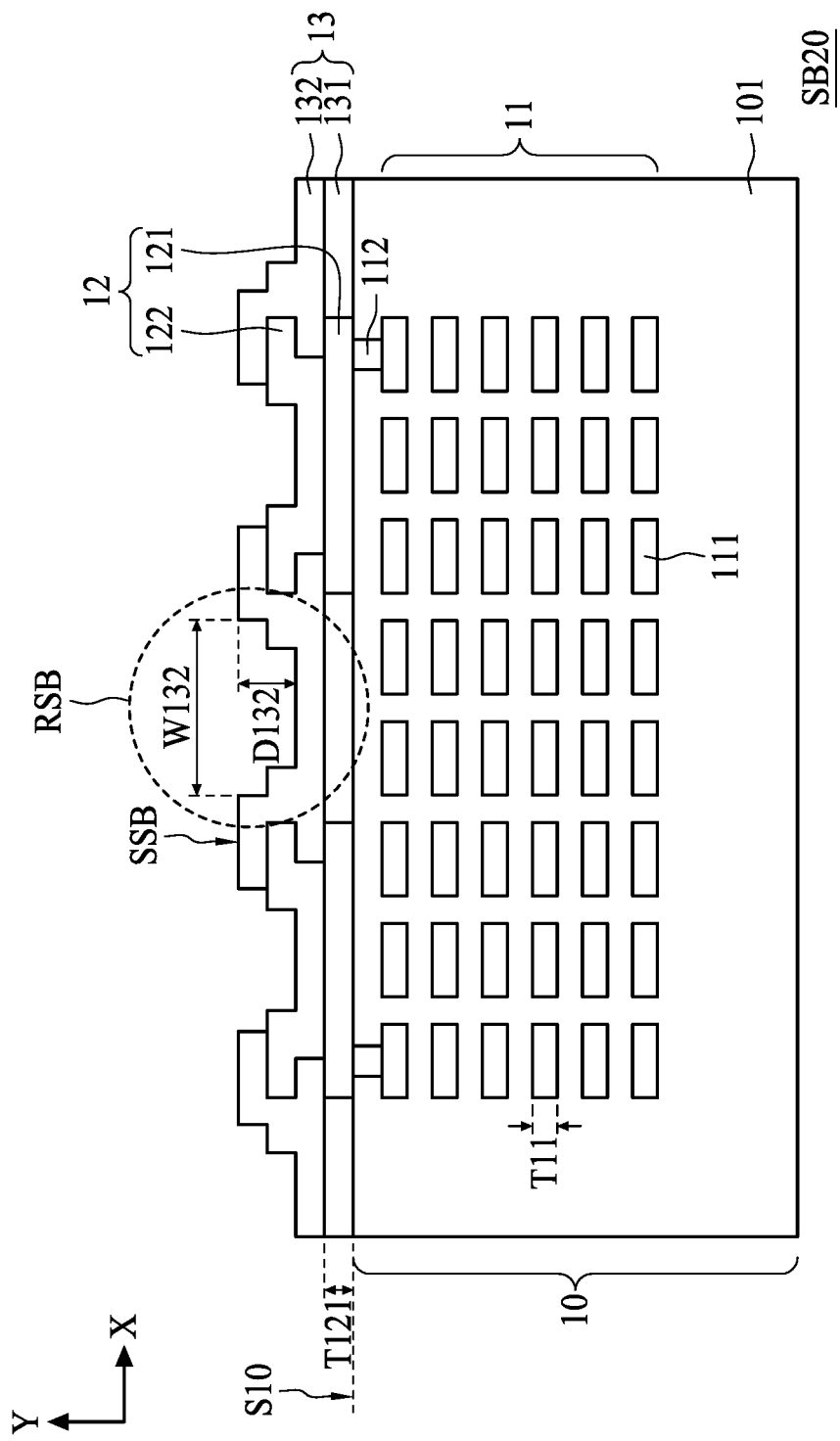
FIGS. 12, 13 and 14 are cross-sectional views of a semiconductor structure in one of numerous operations respectively in accordance with some embodiments of the present disclosure.

Referring to FIG. 12, in accordance with operations (O21) to (O24) and some embodiments of the present disclosure, a semiconductor structure SB20 includes a top surface SSB, wherein the top surface SSB includes a recessed portion RSB. In the embodiments, a plurality of floating capacitors 11 is formed and embedded in a dielectric layer 101 of the substrate 10. The plurality of floating capacitors 11 is physically and electrically isolated from other electrical components in the substrate 10. The recessed portion RSB of the top surface SSB is between adjacent conductive terminals 12. The semiconductor structure SB20 is similar to the semiconductor structure shown in FIGS. 6 and 7. The floating capacitors 11 are electrically connected horizontally along an X direction and vertically along a Y direction in the dielectric layer 101 of the substrate 10 to form a capacitor array. Descriptions of those elements of the semiconductor structure SB20 similar to those of the semiconductor structure SB10 are omitted herein for a purpose of brevity.

Figure 13:
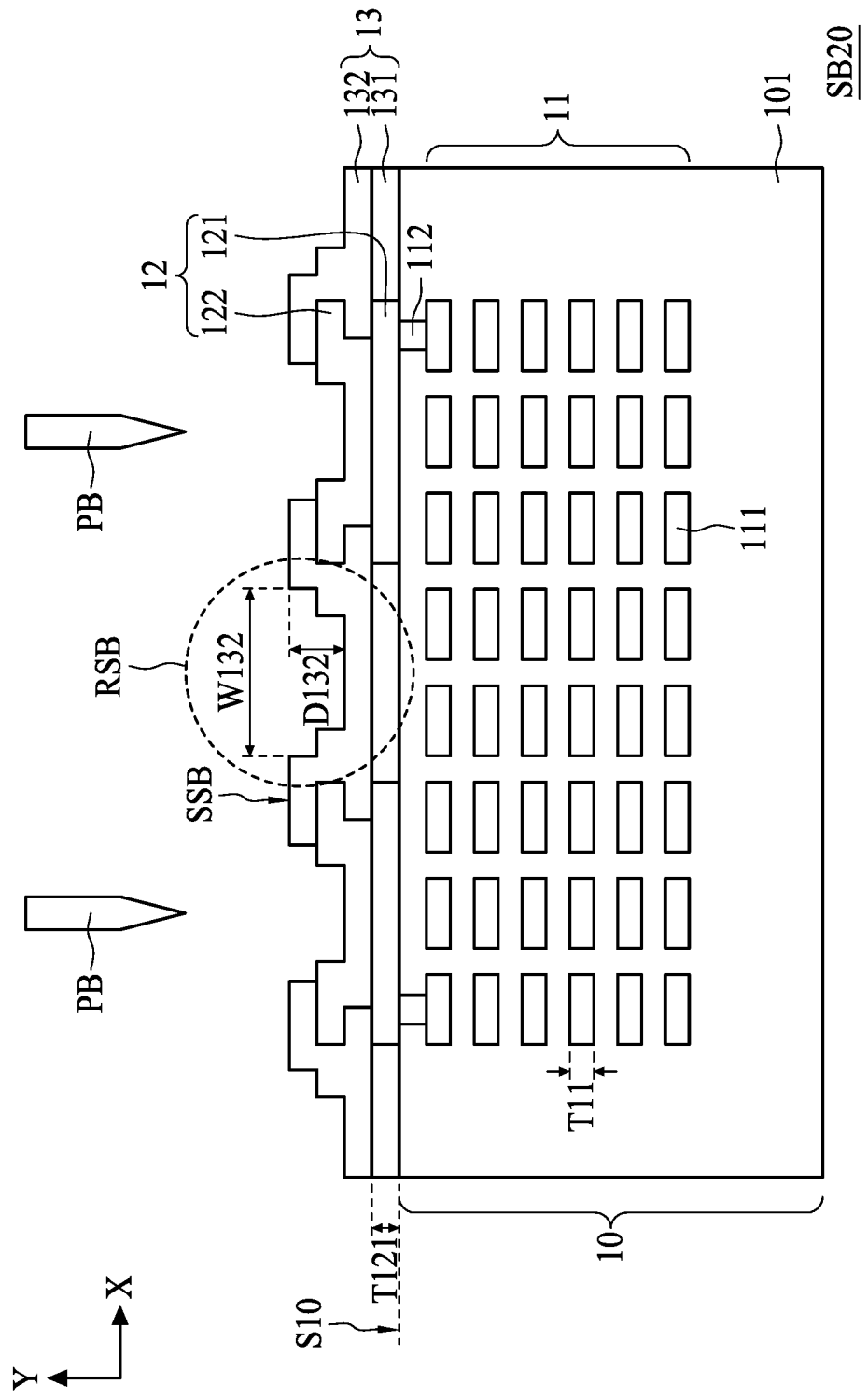

Referring to FIG. 13, in accordance with the operation (O25) and some embodiments of the present disclosure, an electrical parameter of the plurality of floating capacitors 11 is measured via the conductive terminals 12. The recessed portion RSB is has a width W132 and a depth D132 from a cross-sectional view as shown in FIG. 13. It should be noted that a larger ratio of the depth D132 to the width W132 corresponds to a greater stress at the bottom of the recessed portion RSB. Accordingly, a crack can easily occur at the recessed portion RSB. In addition, a heterogeneous interface at (or adjacent to) the recessed portion RSB can also cause a defect to occur at the recessed portion RSB. As illustrated in the description of the method M10 above, in some embodiments of the present disclosure, the plurality of floating capacitors 11 is disposed proximal to the recessed portion RSB for measuring a humidity permeability around or at the recessed portion RSB. In some embodiments of the present disclosure, the electrical parameter includes a leakage current, a resonant frequency, or both a leakage current and a resonant frequency.

Figure 14:
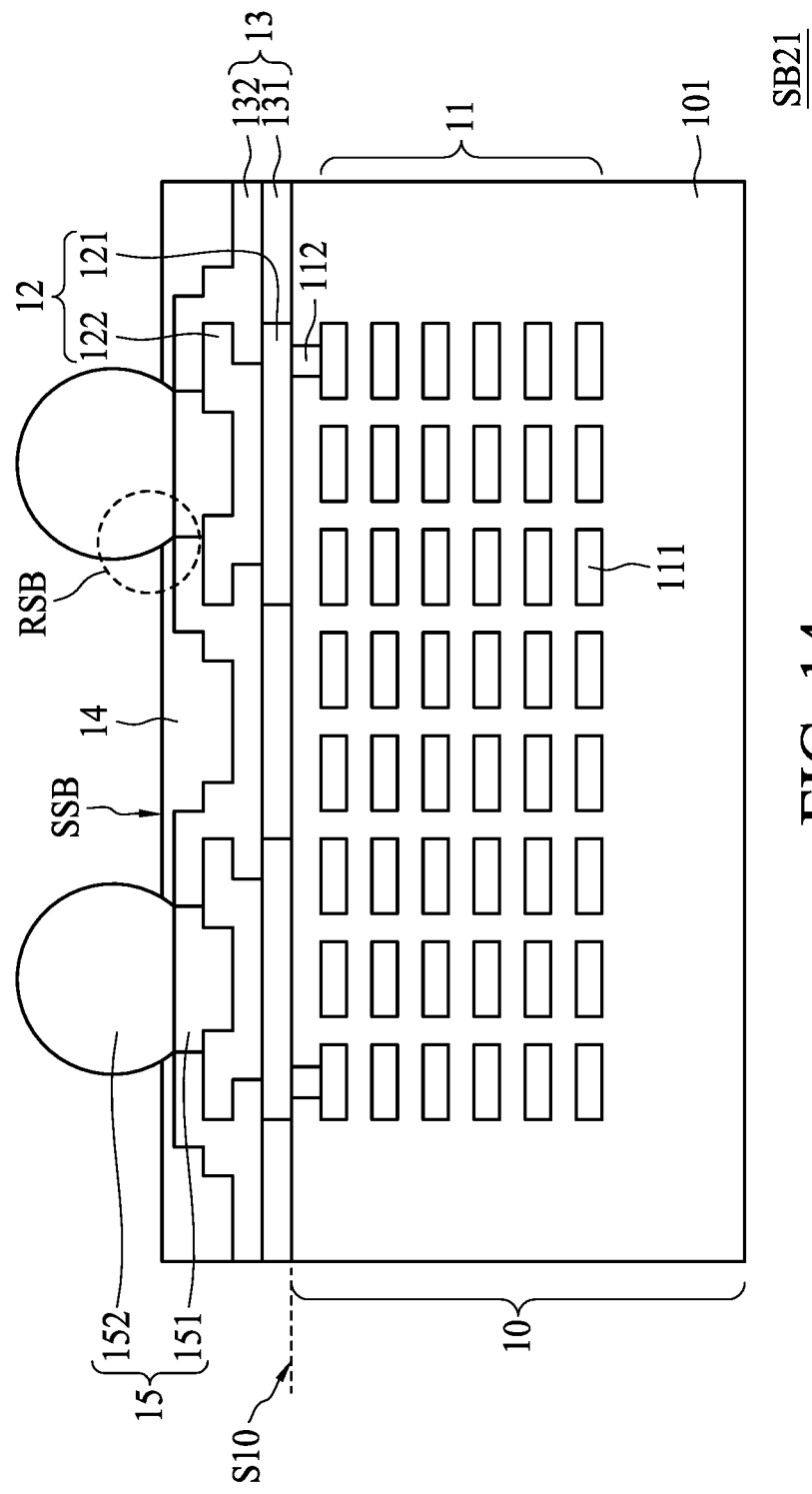

Referring to FIG. 14, in accordance with some embodiments of the present disclosure, a semiconductor structure SB21 is provided by forming a contact 15 and a polymeric layer 14 over the semiconductor structure SB20. The contact 15 and polymeric layer 14 are similar to those of the semiconductor structure SB10, and repeated description is omitted herein.

The semiconductor structure SB21 has a top surface SSB, which includes a recessed portion RSB. The recessed portion RSB is proximal to a conductive terminal 12. In some embodiments of the present disclosure, the recessed portion RSB is between the polymeric layer 14 and the contact 15. In some embodiments of the present disclosure, the recessed portion RSB is defined by a contact ball 152 and the polymeric layer 14. The recessed portion RSB in some embodiments includes a heterogeneous interface as shown in FIG. 14.

In some embodiments of the present disclosure, the contact ball 152 is a protruding portion of the top surface SSB of the semiconductor structure SB21. Pressures applied to the contact ball 152 are transmitted to the recessed portion RSB. A crack can easily happen at or near the recessed portion RSB. In some embodiments of the present disclosure, the method M20 further includes measuring an electrical parameter of the plurality of floating capacitors 11 via the contact 15.

In some embodiments of the present disclosure, the plurality of floating capacitors 11 is formed in a scribe line, a test key or a test area. The test area is electrically isolated from other electrical components of the semiconductor structure SB20 or the semiconductor structure SB21 for a purpose of examination of a mirrored structure formed in the active area. In some embodiments of the present disclosure, the method M20 further includes forming a mirrored structure in the active area mirroring the recessed portion RSB of the top surface SSB in the test area. In some embodiments of the present disclosure, the active area also includes a heterogeneous interface. In order to examine a humidity permeability around a recessed portion in the active area, the active area includes the structure mirroring the recessed portion RSB in the test area. Thus, a percentage of defects occurring in a certain structure having the same recessed portion RSB can be calculated, and an improvement to the certain structure can be achieved based on the electrical parameters obtained from the operation of measuring with a probe.

Some embodiments of the present disclosure provide a method of manufacturing a semiconductor structure. The method includes: providing a conductive terminal exposed from a passivation; forming a capacitor structure under the passivation proximal to a heterogeneous interface; electrically connecting the capacitor to the terminal and isolating the capacitor from other electrical components in the semiconductor device; and probing the conductive terminal to measure an electrical parameter of the capacitor structure covered by the passivation, wherein the electrical parameter corresponds to a humidity permeability at the heterogeneous interface.

Some embodiments of the present disclosure provide a method of manufacturing a semiconductor structure. The method includes: receiving a substrate; forming a plurality of floating capacitors embedded in the substrate and isolated from other electrical components in the substrate; forming a conductive terminal on the substrate and electrically connected with the plurality of floating capacitors; forming a passivation over the substrate and the conductive terminal; and measuring an electrical parameter of the plurality of floating capacitors via the conductive terminal, wherein the electrical parameter corresponds to a humidity permeability proximal to a recessed portion of a surface of the semiconductor structure.

Some embodiments of the present disclosure provide a semiconductor structure. The semiconductor structure includes: a substrate; a plurality of floating capacitors in the substrate, and isolated from other electrical components in the substrate; a conductive terminal on the substrate and electrically connected with the plurality of capacitors; a passivation on the substrate and adjacent to the conductive terminal, wherein a heterogeneous interface is between the passivation and the conductive terminal, and the plurality of floating capacitors are proximal to the heterogeneous interface.

Some embodiments of the present disclosure provide a method of manufacturing a semiconductor structure. The method includes: providing a substrate including an electrical component; forming a capacitor structure in the substrate, proximal to a heterogeneous interface of the substrate, and physically and electrically isolated from the electrical component; forming a conductive terminal over and electrically connected with the capacitor structure; and contacting the conductive terminal with a probe to measure an electrical parameter of the capacitor structure, wherein the electrical parameter corresponds to a humidity permeability at the heterogeneous interface.

Some embodiments of the present disclosure provide a method of manufacturing a semiconductor structure. The method includes: receiving a substrate including a dielectric layer; forming a plurality of capacitors in the dielectric layer; forming a conductive terminal electrically connecting to the plurality of capacitor; measuring an electrical parameter of the plurality of capacitors via the conductive terminal; and forming a contact electrically connecting the conductive terminal if the electrical parameter of the plurality of capacitors being within a predetermined range.

Some embodiments of the present disclosure provide a semiconductor structure. The semiconductor structure includes: a substrate; a plurality of floating capacitors disposed in the substrate; a plurality of conductive terminals disposed over and electrically connecting to the plurality of floating capacitors; and a passivation surrounding to the plurality of conductive terminals, wherein the passivation includes a recessed portion recessed into the passivation from a top surface of the passivation, and the recessed portion of the passivation is disposed between two adjacent conductive terminals.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
providing a substrate including an electrical component;
forming a capacitor structure in the substrate, proximal to a heterogeneous interface of the substrate, and physically and electrically isolated from the electrical component;
forming a conductive terminal over and electrically connected with the capacitor structure; and
contacting the conductive terminal with a probe to measure an electrical parameter of the capacitor structure, wherein the electrical parameter corresponds to a humidity permeability at the heterogeneous interface.

2. The method of claim 1, wherein the electrical parameter is a leakage current or a resonant frequency of the capacitor structure.

3. The method of claim 1, further comprising determining whether the electrical parameter is within a predetermined range.

4. The method of claim 3, wherein if the electrical parameter is not within the predetermined range, a surface analysis on the heterogeneous interface is performed.

5. The method of claim 1, further comprising forming a passivation over the substrate and surrounding the conductive terminal.

6. The method of claim 5, further comprising forming a polymeric layer over the passivation.

7. The method of claim 5, wherein the passivation includes a recessed portion recessed into the passivation from a surface of the passivation, and the capacitor structure is proximal to the recessed portion of the passivation.

8. The method of claim 1, wherein the contact of the conductive terminal with the probe is performed in a non-destructive manner.

9. The method of claim 1, further comprising moving the probe towards or away from the conductive terminal.

10. The method of claim 1, wherein the capacitor structure includes a string of capacitors connected in series or in parallel.

11. The method of claim 1, further comprising defining an active area and a test area, wherein the heterogeneous interface is in the test area, and the test area is electrically isolated from the active area.

12. The method of claim 10, further comprising forming a structure in the active area where the structure mirrors the heterogeneous interface.

13. A method of manufacturing a semiconductor structure, comprising:
receiving a substrate including a dielectric layer;
forming a plurality of capacitors in the dielectric layer;
forming a conductive terminal electrically connecting to the plurality of capacitor;
measuring an electrical parameter of the plurality of capacitors via the conductive terminal; and
forming a contact electrically connecting the conductive terminal if the electrical parameter of the plurality of capacitors being within a predetermined range.

14. The method of claim 13, wherein the formation of the contact is performed after the measurement of the electrical parameter of the plurality of capacitors.

15. The method of claim 13, wherein the plurality of capacitors includes an array of the plurality of capacitors connected horizontally and vertically in the dielectric layer of the substrate.

16. The method of claim 13, wherein the plurality of capacitors are physically and electrically isolated from other electrical components in the substrate.

17. The method of claim 13, further comprising determining that a defect exists if the electrical parameter is shifted by 10% from a default value.

18. A semiconductor structure, comprising:
a substrate;
a plurality of floating capacitors disposed in the substrate;
a plurality of conductive terminals disposed over and electrically connecting to the plurality of floating capacitors; and
a passivation surrounding to the plurality of conductive terminals, wherein the passivation includes a recessed portion recessed into the passivation from a top surface of the passivation, and the recessed portion of the passivation is disposed between two adjacent conductive terminals.

19. The semiconductor structure of claim 18, wherein the plurality of conductive terminals and the recessed portion of the passivation are disposed over the plurality of floating capacitors.

20. The semiconductor structure of claim 18, wherein the plurality of floating capacitors are proximal to the recessed portion of the passivation.

* * * * *